United States Patent [19]

Tuvell et al.

[11] Patent Number: 4,715,014

[45] Date of Patent: Dec. 22, 1987

[54] MODIFIED THREE TRANSISTOR EEPROM CELL

[75] Inventors: James A. Tuvell, Houston; Michael C. Smayling, Missouri City, both of Tex.

[73] Assignee: Texas Instruments Incorporated, Dallas, Tex.

[21] Appl. No.: 793,880

[22] Filed: Nov. 1, 1985

[51] Int. Cl.$^4$ .............................................. G11C 11/40
[52] U.S. Cl. ..................................... 365/185; 365/187
[58] Field of Search ............... 365/185, 187; 357/23.5; 307/446

[56] References Cited

U.S. PATENT DOCUMENTS 4,300,212 11/1981 Simko .................................... 365/185

Primary Examiner—James W. Moffitt
Attorney, Agent, or Firm—Leo N. Heiting; N. Rhys Merrett; Melvin Sharp

[57] ABSTRACT

An electrically erasable programmable semiconductor memory cell having an associated conducting column line, read/write line, sense line and row line includes a floating gate transistor which controls the discharge of the read/write line to the column line during read cycles. During write cycles and precharging of said read/write line the column line is made electrically floating so that a faster precharge time and hence access time is obtained and so that access time is independent on the conducting state of the floating gate transistor resulting at commencement of a read cycle.

7 Claims, 2 Drawing Figures

MODIFIED THREE TRANSISTOR EEPROM CELL

BACKGROUND OF THE INVENTION

The present invention relates to a method of operating an electrically erasable programmable read only memory cell which is independent of the programmed condition of the aforesaid cell.

A basic conventional three transistor electrically erasable programmable read only memory device (EEPROM) exhibits variations in access time depending on whether the EEPROM cell way previously programmed or not. In particular an increase in access time occurs due to the time needed to precharge the read line in the case where the floating gate of the EEPROM cell was made positive during a previous programming operation. In the latter case there results a larger capacitance in the "write" line due to the fact that the positive voltage on the floating gate maintains the transistor coupled between the "read" and "write" lines in a conducting state. Since the read line is in common with all EEPROM cells on a given column, the increase in capacitance of the read line becomes very significant when all cells in a column have been programmed such that their floating gates have a positive potential.

Accordingly, it is an object of this invention to provide an improved electrically erasable programmable memory device with a faster access time.

It is a further object of this invention to provide such a memory device whose access time is independent of the programmed state of the device.

SUMMARY OF THE INVENTION

In accordance with an illustrative embodiment of the invention there is provided an electrically erasable programmable semiconductor memory cell having an associated conducting column line, read/write line, sense line and row line and a floating gate transistor and row transistor. The floating gate transistor controls the discharge of the read/write line to the column line during read cycles. By connecting the column line to 0 volts and precharging the read/write line for unselected cells only the source capacitor of the row transistor is added to the capacitance of the read/write line whether its floating gate has been charged positively or negatively. Thus, a faster precharge time and hence access time is obtained and access time is independent of the conducting state of the floating gate transistor resulting at commencement of a read cycle.

BRIEF DESCRIPTION OF THE DRAWING

The invention will be best understood by reference to the detailed description which follows, read in conjunction with the accompanying drawings, wherein.

DETAILED DESCRIPTION OF THE DRAWINGS

Figure 1:
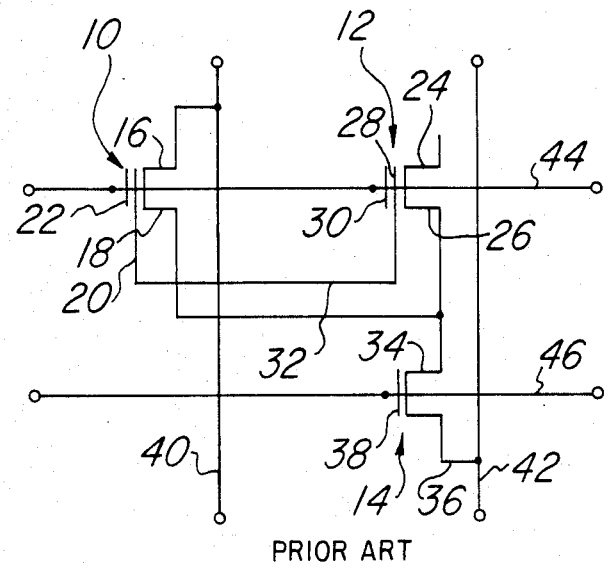
FIG. 1 is a electrical schematic diagram of a conventional EEPROM.

With reference to FIG. 1, a conventional three transistor EEPROM cell consists of a floating gate transistor 10, a tunneling diode device 12 and a row transistor 14. Fabrication techniques for such devices may be made in accordance with procedures similar to the disclosure of copending application Ser. No. 640,721, filed Aug. 14, 1984 and now U.S. Pat. No. 4,628,487 by Michael C. Smayling.

The transistor 10 consists of a source 16 and drain 18, a floating gate 20 and a control gate 22. Source 16 is coupled to a read line 40 while control gate 22 is connected to a sense line 44. Tunnel diode device 12 has a floating gate 28 coupled to floating gate 20 of floating gate transistor 10 while its control gate 30 is also coupled to sense line 44. Row transistor 14 has a source 34 connected to source 26 of tunnel diode 12 a gate 38 connected to a row line 46 and drain 36 coupled to a write line 42.

The cell of FIG. 1 is programmed by leaving its floating gate with either a negative potential or a positive one. In the former case the sense line 44 has its voltage raised to Vpp or approximately 17 volts, the programming voltage, and the voltage on the write line 42 is lowered to a OV. Then with a positive voltage on row line 46 and, hence, on gate 38, row transistor 14 will turn on, electrons will tunnel toward floating gate 28 of tunnel diode device 12 and lower its voltage leaving it with a negative potential.

In the case of leaving the floating gate 20 with a positive potential electrons are tunneled off of the floating gate 20 by lowering the voltage on the sense line 44 to zero volts, raising the voltage on the write line 42 to Vpp and selecting the row line 46 by applying a positive voltage to gate 38 of row transistor 14. Thus, electrons tunnel from gate 28 to source 26 of tunnel diode devie 12. For both of the foregoing programming operations the read line 40 floats during the operation. In the case where electrons are tunneled off of the floating gate 28 the resulting positive potential is enough to keep floating gate transistor 10 on even if the sense line 44 is at zero volts.

The read operation of the EEPROM cell of FIG. 1 proceeds by precharging the read line 40 to Vdd which is typically of the order of 5 volts, connecting write line 42 to zero volts, applying a sense voltage to the sense line 44, and selecting the row line 46 by turning on row transistor 14 with a positive gate voltage. The sense voltage is normally about +2 volts, a value midway between the sense transistor threshold voltage, VT, corresponding to the charged and discharged level of the floating gate. A sense amplifier or data output buffer (not shown) detects whether read line 40 stays at the precharge level Vdd or discharges toward Vss (zero volts) thus producing an output data bit. The tunnel diode device 12 performs no function during the read operation since the voltage across it is too low for any tunneling to take place.

If the floating gate 20 is at a negative potential, transistor 10 will remain off when the EEPROM cell is read and the read line 40 will remain at the precharge level Vdd. However, if gate 20 is at a positive potential, transistor 10 will be on and when a positive row selecting voltage is applied to row line 46, read line 40 will discharge through transistors 10 and 14 to the write line 42. With the floating gate 20 at a negative potential and transistor 10 off the capacitance of the read line 40 is the parasitic capacitance of the read line 40 plus the capacitance of the source area of transistor 10. But with the floating gate 20 at a positive potential, transistor 10 is on for both selected and unselected rows during the read operation. The capacitance of the read line is then the parasitic capacitance of the read line 40 plus the coupled capacitance of the source and gate area of transistor 10 and that of the common drain area of transistors 10 and 14. Since the read line 40 is in common with all EEPROM cells on a given column, the increase in capacitance due to a positive floating gate 20 can be very significant for large arrays when all cells on a column have been programmed such that their floating gates have a positive potential. The effect of such an increased capacitance is to increase the access time.

Figure 2:
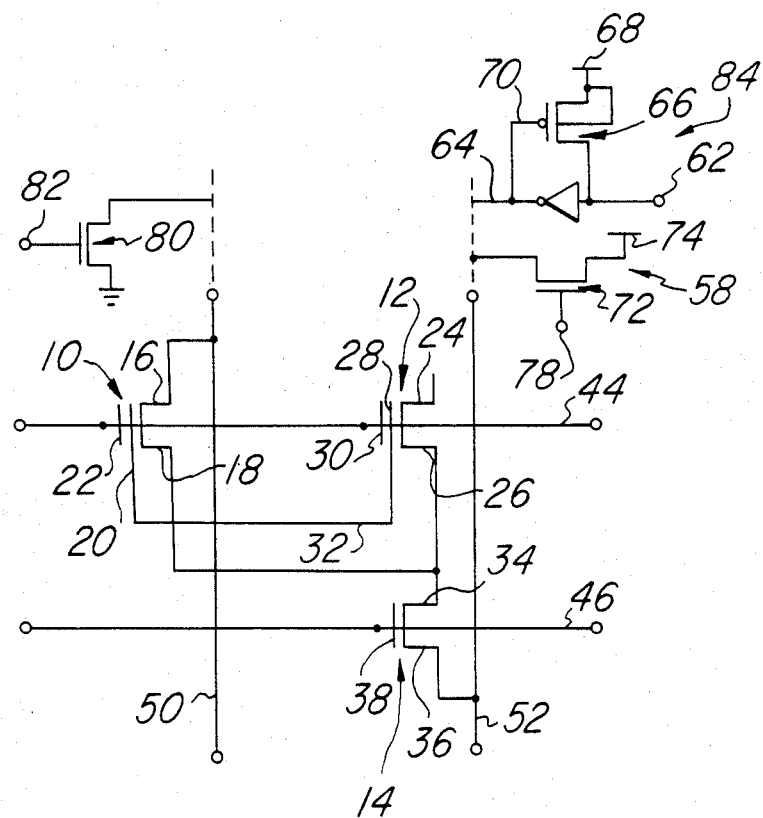
FIG. 2 is an electrical schematic diagram of an EEPROM modified in accordance with the present invention.

A modification in the basic cell shown in FIG. 2 is to convert read line 40 of FIG. 1 into a column line 50 and write line 42 of FIG. 1 into a combination read and write line 52. Thus, a sense amplifier circuit (not shown) is coupled to read/write line 52 rather than to column line 50 in the same way it is coupled to line 40 of a conventional circuit to detect whether the precharge voltage on line 52 discharges or is fixed. A column controller 80 open circuits column line 50 during write cycles and grounds it during read cycles in response to a control signal on its gate 82.

A precharge voltage Vdd on Vdd line 74 is coupled to read/write line 52 through transistor 72 and connects Vdd to line 52 in response to a control signal on gate 78 applied immediately before a read cycle.

A high voltage switching circuit 84 includes an inverter 60, a high voltage Vpp line 68, a p-channel transistor 66 having a source connected to Vpp line 68, a drain connected to the input 62 of inverter 60 and a gate 70 coupled to an output 64 of inverter 60. A "0" signal on input 62 causes a "1" or Vpp at the inverter output 64 which turns off p-channel transistor 66. A "1" signal on 62 causes a "0" at the inverter output 64 which turns on transistor 66 and keeps the input 62 at Vpp.

The programming operation is the same as for the cell of FIG. 1. Electrons are tunneled off of the floating gate 20 by setting the sense line 44 at zero volts, the read/write line 52 at Vpp and the row line 46 at Vpp. Electrons are tunneled onto the floating gate 20 by setting the sense line 44 at Vpp, the read/write line 52 at zero volts and the row line 46 at Vpp. The column line 50 floats for the programming operation.

For the read operation the column line 50 is connected to zero volts, the sense line is set at a suitable sense voltage (+2 volts), the read/write line 52 is precharged by precharging circuit 58, and the row line 46 is selected by application of a voltage Vdd thereto. The capacitance of the read/write line 52 is always equal to the parasitic capacitance of the read/write line 52 plus the capacitance of the drain area of transistor 14 and is thus independent of the programmed state of the EEPROM cell. The latter occurs because column line 50 and sources 18, 34 and 26 are kept floating for unselected rows; i.e., rows for which transistor 14 is kept off. Thus, the present modification allows for faster precharge of the read/write line 52 and therefore faster access time for all programming conditions.

Other variations, modifications and departures lying within the spirit of the invention and scope as defined by the appended claims will be obvious to those skilled in the art.

What is claimed:

1. An electrically erasable programmable semiconductor memory cell having an associated conducting column line, read/write line, sense line and row line, comprising:
    a floating gate transistor having a control gate, a floating gate and a source to drain path at a face of a semiconductor body, the source to drain path coupled at one end to said column line;
    switch means connected between said read/write line and another end of the source to drain path of said floating gate transistor and having a gate coupled to said row line for controlling the opening and closing of said switch in response to a selection voltage signal on said row line; and
    tunnel means coupled to the floating gate of said floating gate transistor, to said read/write line, to said sense line and to said switch means, said tunnel means responsive to predetermined voltages on said sense line,
read/write and row lines to selectively tunnel electrons to or from said floating gate and in response to cause the voltage potential on said floating gate to fall or rise and wherein for read cycles said column line is coupled to ground and said read/write line is precharged.

2. A memory cell according to claim 1, wherein said tunnel means includes a tunnel device having a source coupled to said switch means, a gate coupled to said sense line and a floating gate coupled to the floating gate of said floating gate transistor at a face of the semiconductor body such that in response to exceeding a threshold voltage difference from the floating gate to the source of said tunnel device electrons tunnel between the source and the floating gate thereof.

3. A memory cell according to claim 2, wherein said switch means is a transistor having a gate and a source to drain path at the face of said semiconductor wherein the source of said tunnel device and another end of the source to drain path of said floating gate transistor are coupled to a first end of the source to drain path of said switch means transistor and a second end of the source to drain path of the latter is coupled to said read/write line.

4. A memory cell according to claim 3, wherein the drain of said floating gate transistor is connected to said column line and the drain of the switch means transistor is connected to said read/write line.

5. A memory cell according to claim 1, wherein the drain of said floating gate transistor is coupled to said one column line and the source thereof to the another end of the source to drain path of said row transistor.

6. A memory cell according to claim 2, wherein the one end of the source to drain path of said row transistor is its drain and the another end is its source.

7. An array of electrically erasable programmable semiconductor memory cells, comprising:
    (a) an electrically conducting column line coupled to each column of said cells;
    (b) an electrically conducting read/write line coupled to each column of said cells;
    (c) an electrically conducting sense line coupled to each row of said cells;
    (d) an electrically conducting row line coupled to each row of said cells,
    and wherein each of said cells has;
    (e) a floating gate transistor having a control gate, a floating gate and a source to drain path at a face of a semiconductor body;
    (f) a tunnel device having a source, a floating gate and a tunnel control gate at the face of the semiconductor body;
    (g) a row transistor having a gate and a source to drain path at the face of the semiconductor body; and
    wherein the gate of said row transistor is coupled to an associated one of said row lines and the source to drain path is coupled at one end thereof to an associated one of said read/write lines and at another end in parallel to both a first end of the source to drain path of said floating gate transistor and to the source of said tunnel device, the tunnel control gate of said tunnel device coupled to an associated one of said sense lines and the floating gate of said tunnel device coupled to the floating gate of said floating gate transistor; the second end of the source to drain path of said floating gate transistor coupled to an associated one of said column lines and the control gate thereof coupled to said one sense line, (h) column control means for floating a selected one of said column lines during a write cycle and during precharging of a selected one of said read/write lines at commencement of a read cycle and applying a substantially zero voltage Vss to said one column line during the remainder of the read cycle;

(i) precharging means coupled to said read/write line for precharging the latter immediately prior to a read cycle; and (j) read/write detection means for detecting whether said read/write line stays at the precharge voltage level once precharged or discharges toward voltage level Vss on said one column line.

* * * * *